(12) United States Patent
Mowery et al.

(10) Patent No.: US 6,455,180 B1
(45) Date of Patent: Sep. 24, 2002

(54) FLEXIBLE METHOD FOR MONITORING FUEL CELL VOLTAGE

(75) Inventors: Kenneth D. Mowery, Noblesville; Eugene V. Ripley, Russiaville, both of IN (US)

(73) Assignee: General Motors Corporation, Detroit, MI (US)

( * ) Notice: Subject to any disclaimer, the term of this patent is extended or adjusted under 35 U.S.C. 154(b) by 0 days.

(21) Appl. No.: 09/348,245

(22) Filed: Jul. 2, 1999

(51) Int. Cl.$^7$ ................................................ H01M 8/00
(52) U.S. Cl. ............................ 429/13; 429/23; 429/22
(58) Field of Search ............................. 429/13, 12, 22, 429/23, 18; 324/433, 434

(56) References Cited

U.S. PATENT DOCUMENTS

| | | |
|---|---|---|
| 4,128,700 A | 12/1978 | Sederquist |
| 4,293,315 A | 10/1981 | Sederquist |
| 4,555,454 A | 11/1985 | Shuster |
| 4,642,272 A | 2/1987 | Sederquist |
| 4,650,727 A | 3/1987 | Vanderborgh et al. |
| 4,659,634 A | 4/1987 | Struthers |
| 4,670,359 A | 6/1987 | Beshty et al. |
| 4,678,723 A | 7/1987 | Wertheim |
| 4,816,353 A | 3/1989 | Wertheim et al. |
| 4,923,768 A | 5/1990 | Kaneko et al. |
| 4,994,331 A | 2/1991 | Cohen |
| 5,085,949 A | 2/1992 | Sanderson et al. |
| 5,170,124 A * | 12/1992 | Blair et al. ................. 324/434 |
| 5,248,567 A | 9/1993 | Amemiya et al. |
| 5,271,916 A | 12/1993 | Vanderborgh et al. |
| 5,272,017 A | 12/1993 | Swathirajan et al. |
| 5,316,871 A | 5/1994 | Swathirajan et al. |
| 5,372,617 A | 12/1994 | Kerrebrock et al. |
| 5,429,886 A | 7/1995 | Struthers |
| 5,484,577 A | 1/1996 | Buswell et al. |
| 5,484,666 A | 1/1996 | Gibb et al. |
| 5,518,705 A | 5/1996 | Buswell et al. |
| 5,518,828 A | 5/1996 | Senetar |
| 5,554,453 A | 9/1996 | Stemfeld et al. |
| 5,605,770 A | 2/1997 | Andreoli et al. |
| 5,637,415 A | 6/1997 | Meltser |
| 5,702,838 A | 12/1997 | Yasumoto et al. |
| 5,763,113 A | 6/1998 | Meltser et al. |
| 5,789,091 A | 8/1998 | Woznickzka et al. |
| 6,096,449 A * | 8/2000 | Fuglevand et al. ............ 429/13 |

FOREIGN PATENT DOCUMENTS

| | | |
|---|---|---|
| DE | 195 23 260 A1 | 3/1997 |
| EP | 0 918 363 A1 | 11/1997 |
| WO | WO 91/19328 | 6/1991 |

OTHER PUBLICATIONS

Szaniszlo, "The Advanced Low–Emissions Catalytic–Combustor Program: Phase I—Description and Status," ASME #79–GT–192, 03/79.

(List continued on next page.)

Primary Examiner—Gabrielle Brouillette
Assistant Examiner—R Alejandro
(74) Attorney, Agent, or Firm—Cary W. Brooks

(57) ABSTRACT

A method for equalizing the measured voltage of each cluster in a fuel cell stack wherein at least one of the clusters has a different number of cells than the identical number of cells in the remaining clusters by creating a pseudo voltage for the different cell numbered cluster. The average cell voltage of the all of the cells in the fuel cell stack is calculated and multiplied by a constant equal to the difference in the number of cells in the identical cell clusters and the number of cells in the different numbered cell cluster. The resultant product is added to the actual voltage measured across the different numbered cell cluster to create a pseudo voltage which is equivalent in cell number to the number of cells in the other identical numbered cell clusters.

9 Claims, 3 Drawing Sheets

OTHER PUBLICATIONS

Krill et al., "Catalytic Combustion for System Applications," ASME #79–HT–54, 08/79.

Hall et al., "A Porous Media Burner for Reforming Methanol for Fuel Cell Powered Electric Vehicles," SAE Paper #950095, 03/95.

Natural Gas Power Plant System (a descriptive drawing) No date available.

Derwent Abstract and Summary for EP 0 918 363 A1.

Derwent Abstract and Summary for DE 19523260A1.

European Search Report on European Patent Application No. EP0110375.

* cited by examiner

FLEXIBLE METHOD FOR MONITORING FUEL CELL VOLTAGE

CROSS REFERENCE TO CO-PENDING APPLICATIONS

The present application discloses subject matter which is disclosed and claimed in co-pending U.S. patent application Ser. No. 09/436,819, filed on Nov. 9, 1999, and entitled "Fuel Cell Voltage Monitoring and System Control" and U.S. patent application Ser. No. 09/358,080, filed on Jul. 21, 1999, and entitled "Methanol Tailgas Combustor Control Method", the entire contents of both of which are incorporated herein by reference.

Statement of Government Support

The Government of the United States of America has right in this invention pursuant to Agreement No. DE-AC02-90CH10435 awarded by the U.S. Department of Energy.

FIELD OF THE INVENTION

This invention relates to a fuel cell system, and more particularly to a system having a plurality of cells which consume an $H_2$-rich gas to produce power for vehicle propulsion.

BACKGROUND OF THE INVENTION

Fuel cells have been used as a power source in many applications. Fuel cells have also been proposed for use in electrical vehicular power plants to replace internal combustion engines. In proton exchange membrane (PEM) type fuel cells, hydrogen is supplied to the anode of the fuel cell and air is supplied as the oxidant to the cathode. PEM fuel cells include a "membrane electrode assembly" (MEA) comprising a thin, proton transmissive, solid polymer membrane-electrolyte having the anode on one of its faces and the cathode on the opposite face. The MEA is sandwiched between a pair of electrically conductive elements which (1) serve as current collectors for the anode and cathode, and (2) contain appropriate channels and/or openings therein for distribution the fuel cell's gaseous reactants over the surfaces of the respective anode and cathode catalysts. A plurality of individual cells are commonly bundled together to form a PEM fuel cell stack. The term fuel cell is typically used to refer to either a single cell or a plurality of cells (stack) depending on the context. A group of cells within the stack, typically adjacent cells, is referred to as a cluster.

In PEM fuel cells hydrogen ($H_2$) is the anode reactant (i.e., fuel) and oxygen is the cathode reactant (i.e., oxidant). The oxygen can be either a pure form ($O_2$), or air (a mixture of $O_2$ and $N_2$). The solid polymer electrolytes are typically made from ion exchange resins such as perfluoronated sulfonic acid. The anode/cathode typically comprises finely divided catalytic particles, which are often supported on carbon particles, and admixed with a proton conductive resin. The catalytic particles are typically costly precious metal particles. These membrane electrode assemblies which comprise the catalyzed electrodes, are relatively expensive to manufacture and require certain controlled conditions in order to prevent degradation thereto.

For vehicular applications, it is desirable to use a liquid fuel such as an alcohol (e.g., methanol or ethanol), or hydrocarbons (e.g., gasoline) as the source of hydrogen for the fuel cell. Such liquid fuels for the vehicle are easy to store onboard and there is a nationwide infrastructure for supplying liquid fuels. However, such fuels must be dissociated to release the hydrogen content thereof for fueling the fuel cell. The dissociation reaction is accomplished heterogeneously within a chemical fuel processor, known as a reformer, that provides thermal energy throughout a catalyst mass and yields a reformate gas comprising primarily hydrogen and carbon dioxide. For example, in the steam methanol reformation process, methanol and water (as steam) are ideally reacted to generate hydrogen and carbon dioxide according to this reaction: $CH_3OH+H_2O \rightarrow CO_2+3H_2$. The reforming reaction is an endothermic reaction that requires external heat for the reaction to occur.

Fuel cell systems which process a hydrocarbon fuel to produce a hydrogen-rich reformate for consumption by PEM fuel cells are known and are described in co-pending U.S. patent application Ser. Nos. 08/975,442 and 08/980,087, filed in the name of William Pettit in November, 1997, and U.S. Ser. No. 09/187,125, filed Nov. 5, 1998, and each assigned to the assignee of the present invention. A typical PEM fuel cell and its membrane electrode assembly (MEA) are described in U.S. Pat. Nos. 5,272,017 and 5,316,871, issued respectively Dec. 21, 1993 and May 31, 1994, each assigned to the assignee of the present invention.

For vehicular power plants, the reaction within the fuel cell must be carried out under conditions which preserve the integrity of the cell and its valuable polymeric and precious metal catalyst components. Since the anode, cathode and electrolyte layers of the MEA assembly are each formed of polymers, it is evident that such polymers may be softened, melted or degraded if exposed to too high a temperature.

A typical fuel cell system does not directly monitor the rate of hydrogen flow to the fuel cell; that is, a hydrogen sensor is not located directly upstream of the fuel cell. In such a fuel cell system, it is important to match the load being demanded of the fuel cell with the rate at which hydrogen is supplied to the fuel cell. If more current is attempted to be drawn out of the fuel cell than the fuel cell is capable of supplying because there is not enough hydrogen to create the increased electrical power, then it is possible to significantly degrade the fuel cell stack.

If the vehicle propulsion system continues to increase the load and allows the cell voltage to continue to decline, deterioration of one or more individual cells can result and it is also possible to incur a permanent reverse polarity. In this situation, a cell begins acting as a resistor and will start heating up. As the cell continues to heat up, it will adversely affect the cell next to it and, if heat effect is not abated, it is possible to melt components of the fuel cell.

Although it is possible to obtain the overall voltage of the fuel cell stack, this does not indicate the existence of one problem cell within the stack. In other words, a small voltage drop occurring at a number of the cells could not be distinguished from a large voltage drop in one problem or weak cell.

This is evident by an example where the fuel cell stack might have, for example, 200 cells at 0.7 to 0.8 volts each at a given load. In a circumstance where 3 cells drop from 0.75 volts to 0.0 volts the overall fuel stack voltage changes from 150 volts to 147.75 volts. This latter value is well above the expected voltage if all of the cells were at 0.7 volts, that is, at the lower range indicating a stack voltage of 140 volts which is nominally acceptable.

While it would be advantageous to monitor the voltage of each cell in a stack, from an economic view point this is not strictly necessary or desirable. Since a typical PEM fuel cell stack, sized for use in automotive power and voltage ranges, contains approximately 150 to 200 cells, the logistic of reading all of the 150 to 200 cell voltages can become a significant task, with respect to hardware connections. Also, due to the sheer size of the data being processed from each of the 150 to 200 cells, care must be taken to design efficient software to collect and process all of the cell voltage information.

Therefore, a typical approach relies on monitoring groups of cells, referred to as "clusters" instead each individual cell. Care must be taken not to group too many cells together in a cluster since the total contribution of each cell's output to the chosen cluster output must be large enough so that an individual poor performing cell can be resolved from the condition where are cells in the cluster are on the low side of nominal performance. This resolution limitation usually results in either three or four cells being grouped together in a cluster.

Historically, when forcing a cluster monitoring requirement on the fuel cell stack design, the result is that the stack must be designed with a total number of cells which have a numerical modulus equal to the number of cells in each monitored cluster in order not to leave any cell(s) unmonitored. This poses a problem when there is a need to change the number of cells in a cluster for a given stack design. Additionally, adding "extra" cells to a new fuel cell design just to make the number of cells convenient for the monitoring system is not considered a good economic practice.

Thus, it would be desirable to provide a method for diagnostic monitoring of fuel cell clusters containing any number of cells per cluster which can be interfaced to fuel cell stack designs containing any total number of cells. It would also be desirable to provide a method for diagnostic monitoring of a fuel cell stack which avoids the design and calibration of a unique monitoring approach only for a cluster containing less than the identical number of cells per cluster in the remaining portion of the fuel cell stack. It would also be desirable to provide a monitoring technique for a fuel cell which enables a fixed number of cells to be included in each cluster without requiring rearrangement or rewriting of the monitoring software for the addition or removal of cells from the fuel cell stack.

SUMMARY OF THE INVENTION

The present invention is a method of monitoring a fuel cell apparatus wherein a hydrogen-rich stream is supplied to a fuel cell stack, wherein the fuel cell stack includes a plurality of first clusters formed of identical number of fuel cells and at least one second cluster formed of a different number of fuel cells. The present method includes the following steps:

(a) measuring the voltage across the entire fuel cell stack;

(b) measuring the voltage across the second cluster of fuel cells; and (c) creating a pseudo cluster voltage for the second cluster based on the average cell voltage of all of the cells in the fuel cell stack, the actual voltage across the second cluster and the difference between the number of cells in the first clusters and the number of cells in the second cluster.

In a specific aspect, the method of the present invention includes the following steps:

(a) measuring the total voltage across all of the fuel cells in the stack;

(b) determining the average cell voltage for the entire stack;

(c) multiplying the average cell voltage for the entire stack by the difference between the number of cells in each of the first clusters and the number of cells in the second cluster; and (d) adding the product of (c) to the actual voltage across the second cluster.

In another specific aspect, the inventive method determines the difference between the number of cells in each of the first clusters and the number of cells in the second cluster to form a constant;

multiplies the constant and the average cell voltage across the entire stack; and adds the product of step (b) to the actual measured voltage across the second cluster.

In a broad aspect of the invention, the present inventive method adjusts the measured voltage across the second cluster by a factor equivalent to the average cell voltage of all the cells in the fuel cell stack for each different fuel cell between the number of fuel cells in the second cluster and the number of fuel cells in the first cluster.

The method of the present invention provides significant advantages in fuel cell design and diagnostic monitoring. The present inventive method enables the cells of a fuel cell stack to be monitored in clusters containing a small number of cells regardless of the number of cells forming each cluster. This enables a single monitoring program or circuit to monitor each fuel cell cluster regardless of the number of cells in each cluster. This avoids the necessity of designing a new monitoring control program or circuit just for the clusters containing a different number of cells. More importantly, the monitoring method of the present invention enables a fuel cell stack to be devised with any number of cells to meet particular application requirements without the necessity of adding or eliminating individual fuel cells just for monitoring purposes.

BRIEF DESCRIPTION OF THE DRAWING

The various features, advantages and other uses of the present invention will become more apparent by referring to the following description and drawings in which.

DETAILED DESCRIPTION OF THE PREFERRED EMBODIMENT

The invention is hereafter described in the context of a fuel cell fueled by a methanol (MeOH) fuel processor. However, it is to be understood that the principles embodied herein are equally applicable to fuel cells fueled by other fuels, such as ethanol or gasoline, which utilize a fuel processor for conversion into a hydrogen rich stream.

Figure 1:
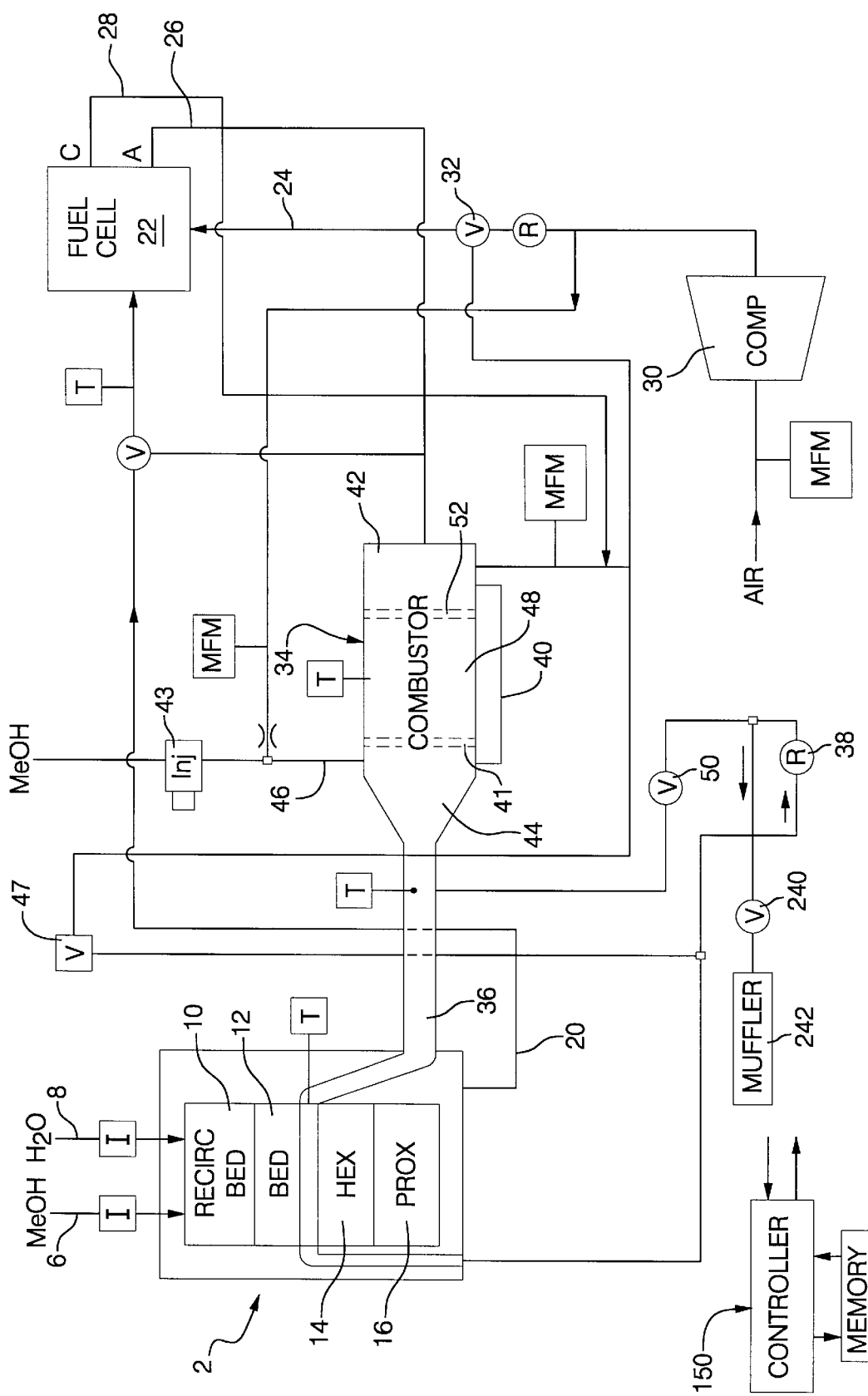
FIG. 1 is a flow diagram showing an exemplary vehicle fuel cell system usable with the monitoring method of the present invention.

By way of background, as shown in FIG. 1, a fuel cell apparatus usable as an energy source for vehicle propulsion includes a fuel processor 2 for catalytically reacting methanol from a methanol stream 6 and water or steam from a water stream 8 in a recirculating bed 10 and a catalytic bed 12 to form a hydrogen-rich reformate gas stream. A heat exchanger 14 is interposed between the catalytic bed 12 and a preferential oxidation (PROX) reactor 16. The reformate output gas stream comprises primarily $H_2$ and $CO_2$, but also includes $N_2$, CO and water. The reformate stream passes through the preferential oxidation (PROX) reactor 16 to reduce the CO-levels therein to acceptable levels (i.e., below 20 ppm). The $H_2$ rich reformate 20 is then fed into the anode chamber of a fuel cell 22. At the same time, oxygen (e.g., air) from an oxidant stream 24 is fed into the cathode chamber of the fuel cell 22. The hydrogen from the reformate stream 20 and the oxygen from the oxidant stream 24 react in the fuel cell 22 to produce electricity.

Exhaust or effluent 26 from the anode side of the fuel cell 22 contains some unreacted hydrogen. The exhaust or effluent 28 from the cathode side of the fuel cell 22 contains some unreacted oxygen. Air for the oxidant stream 24 is provided by a compressor 30 and is directed to the fuel cell 22 by a valve 32 under normal operating conditions. During start-up, however, the valve 32 is actuated to provide air to the input of a combustor 34 used to heat the fuel processor 2, as will be described in more detail hereinafter.

Heat from the heat exchanger 14 heats the catalyst bed(s) 10 and 12 in the fuel processor 2 and also heats the PROX 16. In this regard, the $H_2O$-MeOH mixture supplied to the fuel processor 2 will be vaporized and preferably be recirculated/refluxed several times (e.g., 20×) through the recirculating bed 10 in the fuel processor 2, the heat exchanger side of the bed 12, the PROX 16 and the heat exchanger 14 such that the mixture also functions as a heat transfer medium for carrying heat from the heat exchanger 14 into the beds 10 and 12 of the fuel processor 2 and to the PROX 16.

The heat exchanger 14 itself is heated from exhaust gases 36 exiting the catalytic combustor 34. The gases 36 exiting the heat exchanger 14 are still hot and could be passed through an expander, not shown, which could drive the compressor 30 or utilized in another manner. In the present implementation, as shown in FIG. 1, the exhaust gases from the fuel processor 2 pass through a regulator 38, a shutoff valve 240 and a muffler 242 before being dumped to atmosphere.

MeOH vapor 40 emanates from a vaporizer 41 nested in the exhaust end 44 of the combustor 34. The vaporizer 41 is a heat exchanger that extracts heat from the combustor 34 exhaust to vaporize a first fuel stream, such as liquid MeOH 46 provided to the vaporizer 41 by fuel metering device 43 from the vehicle's fuel tank. The MeOH vapor 40 exiting the vaporizer 41 and the anode effluent 26 are reacted in a catalyst section 48 of the combustor 34 lying intermediate the inlet and exhaust ends 42 and 44 respectively of the combustor 34. Oxygen is provided to the combustor 34 either from the compressor 30 (i.e., via valve 32) or from a second air flow stream, such as a cathode effluent stream 28 depending on system operating conditions. A valve 50 permits dumping of the combustor exhaust 36 to atmosphere when it is not needed in the fuel processor 2.

Further details concerning the construction of the combustor 34 can be had by referring to pending U.S. patent applications Ser. Nos. 08/975,422 and 08/980,087 filed in the name of William Pettit in November 1997, the entire contents of which are incorporated herein by reference.

An electric heating element 52 is provided upstream of the catalyst bed 48 in the combustor 34 and serves to vaporize the liquid fuel 46 entering the combustor 34, heat the gas entering the bed 48 as well as preheating the bed 48 during start-up of the combustor 34. The heating element 52 may or may not be catalyzed. After start-up, as described hereafter, the electric heater 52 is no longer required since the fuel will be vaporized by the exhaust gases emanating from the exhaust end 44 of the combustor 34. A preferred electric heater 52 comprises a commercially available, uncatalyzed extruded metal monolith resistance element such as is used to light off the catalyst of a catalytic converter used to treat IC engine exhaust gases.

The exhaust end 44 of the combustor 34 includes a chamber that houses the vaporizer 41 which is a coil of metal tubing which is used to vaporize liquid fuel to fuel the combustor 34. More specifically, under normal post-start-up conditions, air or cathode effluent 28 may be introduced into the inlet end of the coil and mixed with liquid fuel sprayed into the inlet end via a conventional automotive type fuel injector. The airborne atomized fuel passes through the several turns of the heated coil tube, and therein vaporizes and exits the tube at an outlet which is located in the cathode effluent supply conduit. This vaporized first fuel stream supplements a second fuel stream or anode effluent 26 as fuel for the combustor 34 as may be needed to meet the transient and steady state needs of the fuel cell apparatus. The vaporizer coil is sized to vaporize the maximum flow rate of fuel with the minimum combustor exhaust flow rate, and is designed to operate at temperatures exceeding the autoignition temperature of the MeOH-air mixture therein throughout its fuel operational range. Autoignition within the vaporizer is avoided, however, by insuring that the velocity of the mix flowing through the coil significantly exceeds the worst-case flame speed of the mixture which varies with the composition of the inlet streams.

As shown in FIG. 1, and as described in greater detail hereafter, the amount of heat demanded by the fuel processor 2 which is to be supplied by the combustor 34 is dependent upon the amount of fuel input to the combustor 34 and the desired reaction temperature in the combustor 34. To supply the heat demand of the fuel processor 2, the combustor 34 utilizes all anode exhaust or effluent and potentially some liquid fuel. Enthalpy equations are used to determine the amount of cathode exhaust or air to be supplied to the combustor 34 to meet the desired heat requirements of the fuel processor 2. The oxygen, air or air-like stream provided to the combustor 34 includes one or both of cathode effluent exhaust 28 which is typically a percentage of the total oxygen supplied to the cathode of the fuel cell 22 and a compressor output air stream depending on whether the apparatus is operating in a start-up mode wherein the compressor air stream is exclusively employed or in a run mode using the cathode effluent 28 and/or compressor air. In the run mode, any total air, oxygen or diluent demand required by the combustor 34 which is not met by the cathode effluent 28 is supplied by the compressor 30 in an amount to balance the enthalpy equations to reach the desired reaction temperature within the combustor 34 so as to supply the amount of heat required by the fuel processor 2 at the desired temperature.

The air quality control is implemented via an air dilution valve 47 which is a stepper motor driven valve having a variable orifice to control the amount of bleed-off of cathode exhaust supplied to the combustor 34 and potentially the system exhaust, which bled-off air is dumped to atmosphere through the regulator 38, the valve 40, and the muffler 42. A further description of the air dilution valve 47 will be presented hereafter in conjunction with the various modes or sequences of operation of the combustor 34.

The fuel cell apparatus of the present invention operates as follows. At the beginning of operations when the fuel cell apparatus is cold and starting up: (1) the compressor 34 is driven by an electric motor energized from an external source (e.g., a battery) to provide the necessary system air; (2) air is introduced into the combustor 34 as well as the input end of the vaporizer 41; (3) liquid fuel 46 (e.g., MeOH) is injected into the inlet end of the vaporizer 41 via a fuel injector, and atomized as fine droplets with the air flowing therein; (4) the air-MeOH droplet mix exits the vaporizer 41 and mixes with compressor air introduced into the combustor 34, and is then introduced into the input end 42 of the combustor 34; (5) the mix passes through a flame arrestor in the front of the combustor 34; (6) the mix is then heated by the heater 52 to vaporize the liquid droplets and heat the mixture; (7) the preheated vaporous mix then enters a mixing-media bed for still further intimate mixing before contacting the light-off catalyst bed; (8) upon exiting the mixing-media bed, the mix begins oxidizing on the light-off catalyst bed just before it enters a primary catalyst bed 48, or reacting section of the combustor 34, where substantially complete combustion of the fuel is effected; and (9) the hot exhaust gases exiting the catalyst bed are conveyed to the heat exchanger 14 associated with the fuel processor 2.

Once the fuel processor's temperature has risen sufficiently to effect and maintain the reformation process: (1) valve 32 is activated to direct air to the cathode side of the fuel cell 22; (2) MeOH and water are fed to the fuel processor 2 to commence the reformation reaction; (3) reformate exiting the fuel processor 2 is fed to the anode side of the fuel cell 22; (4) anode effluent 26 from the fuel cell 22 is directed into the combustor 34; (5) cathode effluent 28 from the fuel cell 22 is directed into the combustor 34; (6) air is introduced into the vaporizer 41; (7) liquid methanol is sprayed into the vaporizer 41; (8) the methanol-air mix circulates through the heated vaporizer coil where the MeOH vaporizes; (9) the Air-MeOH$_v$ mix along with the cathode effluent 28 then mixes with the anode effluent 26; and (10) the mix is burned on the catalyst bed of the combustor 34.

During normal (i.e., post start-up) operating conditions, the heater 52 is not used as the vaporizer 41 alone vaporizes the MeOH and preheats the MeOH-air mix. Under certain conditions, as described hereafter, the combustor 34 could operate solely on the anode and cathode effluents, without the need for additional MeOH fuel from the vaporizer 41. Under such conditions, MeOH injection to the combustor 34 is discontinued. Under other conditions, e.g., increasing power demands, supplemental fuel is provided to the combustor 34.

As described above, the combustor 34 receives multiple fuels, such as a methanol-air mix as well as anode effluent 26 from the anode of the fuel cell 22. Oxygen depleted exhaust air 28 from the cathode of the fuel cell 22 and air from the compressor 30 are also supplied to the combustor 34.

According to the present invention, a controller 150 shown in FIG. 1 controls the operation of the combustor 34. Anode exhaust or effluent plus a liquid fuel, i.e., methanol, if required, support the energy requirements of the combustor 34. An enthalpy balance maintains the desired reaction by temperature controlling the amount of air and/or cathode exhaust supplied to the combustor 34 to meet all fuel processor heat requirements.

It should be noted that the energy requirements of the apparatus components are expressed herein in terms of power. This is for convenience and is meant to express an energy rate, often in units of kilowatts, rather than BTU per second.

The controller 150 may comprise any suitable microprocessor, microcontroller, personal computer, etc., which has central processing unit capable of executing a control program and data stored in a memory. The controller 150 may be a dedicated controller specific to the combustor 34 or implemented in software stored in the main vehicle electronic control module. Further, although the following description describes a software based control program for controlling the combustor 34 in various modes of operation or sequence, it will also be understood that the combustor control can also be implemented in part or whole by dedicated electronic circuitry.

According to the present example, the controller 150 controls the operation of the combustor 34 in six different modes or sequences of operation. The separate modes of operation include (1) combustor start-up, (2) combustor operation during fuel processor warm-up, (3) combustor operation during fuel processor start-up, with the fuel cell off-line, (4) combustor operation during fuel processor run mode with the fuel cell stack on-line, (5) combustor shut down, and (6) combustor diagnostics.

Further details concerning the operation of the combustor 34 in all modes of operation of the fuel cell can be had by referring to co-pending U.S. patent application Ser. No. 08/358,080 filed in Jul. 21, 1999, in the names of David J. Hart-Predmore and William H. Pettit, entitled "Methanol Tailgas Combustor Control Method", the entire contents of which are incorporated herein by reference.

Figure 2:
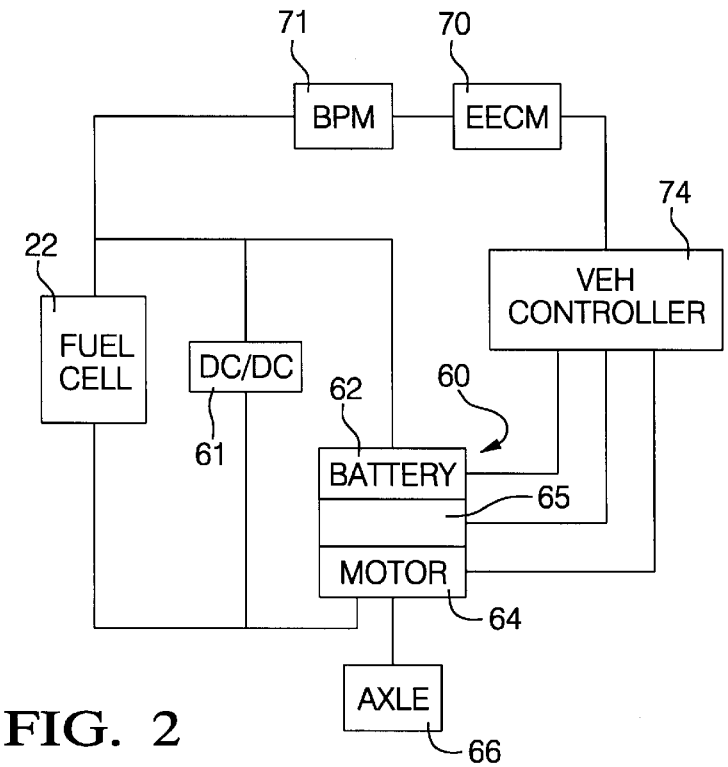
FIG. 2 is a schematic diagram showing the connection of the fuel cell of FIG. 1 in a vehicle.

In a preferred embodiment, the fuel cell system comprises the fuel cell 16 as part of a circuit 60 (see FIG. 2) wherein a portion of the external circuit 60, comprises a battery 62, an electric motor 64 and drive electronics 65 constructed and arranged to accept electric energy from a DC/DC converter 61 coupled to the fuel cell 16 and to convert it to mechanical energy produced by motor 64. The battery 62 is constructed and arranged to accept and store electrical energy supplied by fuel cell 22 and to provide electric energy to motor 64. The motor 64 is coupled to driving axle 66 to rotate wheels of a vehicle (not shown). An electrochemical engine control module (EECM) 70 and a battery pack module (BPM) 71 monitor various operating parameters, including, but not limited to, the voltage and current of the stack which is done by the battery pack module 71, for example. The BMP 71 sends an output signal (message) to the vehicle controller 74 based on conditions monitored by the BMP 71. The vehicle controller 74 controls operation of the battery 62, the drive electronics 65 and the electric motor 64 in a conventional manner.

Figure 3:
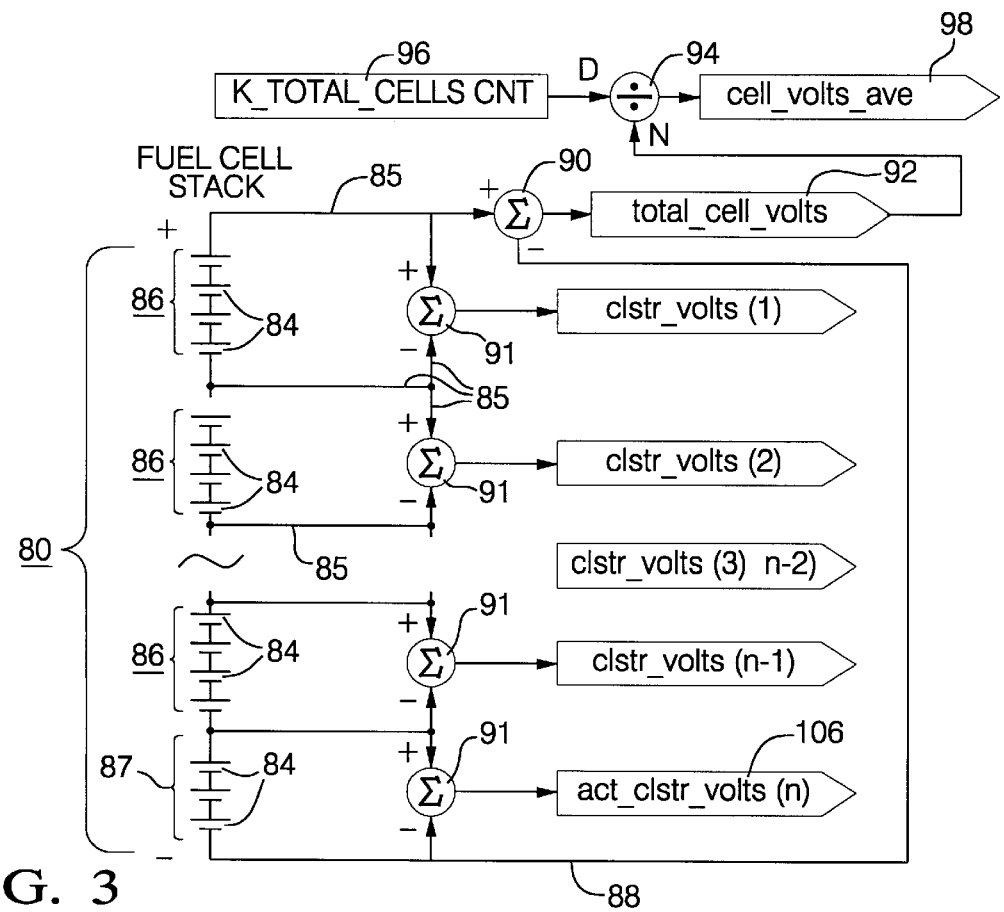
FIG. 3 is a pictorial drawing showing cells of a fuel cell stack arranged in clusters with connections for voltage monitoring according to the present invention.

The term "fuel cell" is also used to refer to a fuel cell stack which contains many individual fuel cells as further illustrated in FIG. 3. Thus, fuel cell 22 of FIG. 3 in a typical arrangement consists of many cells 84 called a stack 80. The fuel cell stack 80 consists of a plurality of cells 84, often on the order of one hundred or more, connected in series. Each cell 84 within the stack 80 comprises the membrane electrode assembly described earlier, and each such cell 84 provides its increment of voltage.

A group of cells within the stack is referred to as a "cluster", with the stack 80 being formed of a plurality of first clusters 86, each formed of an identical number of cells 84, and a single endmost or last cluster 87 having a different number of cells than the identical number of cells 84 in the first clusters 86. Typically, the number of cells per cluster is on the order of three or four cells. Four cells 84 in each first cluster 86 is shown and described by way of example only. Other number of cells could also be selected to form a plurality of like clusters 86.

The second cluster 87 is formed of three cells 84 by example. This results from a particular application power requirement, space consideration, etc., which results in a total number of cells which are not devisable by the common number of cells 84 in the first clusters 86. One or two cells could also form the second cluster 87.

As described in co-pending patent application filed in July, 1999, in the names of Donald H. Keskula, Bruce J. Clingerman, and Robert W. Chalfant, and entitled "Fuel Cell Voltage Monitoring and System Control", the entire contents of which are incorporated herein by reference, the voltage of each cluster 86 is monitored and compared with predetermined voltage safety levels to detect and/or provide an early detection of a low cell voltage within the stack 80 before the low voltage cell can degrade adjacent cells or even the entire stack 80.

It is preferred that monitoring method be identical for each cluster 86 to implement economies in hardware and software design. However, according to the present invention, the different number of cells 84 in the second cluster 87 is compensated for by the unique method described hereafter.

In FIG. 3, each of the first clusters 86 of individual cells 84 are able to be monitored individually and essentially simultaneously by means of conductors 85 which connect a positive electrode and a negative electrode of each cluster 86 to a summing node or voltage measurement device denoted by reference number 91. The summing node or device 91 provides a cumulative voltage for the cells 84 in the respective cluster 86. The output of each summing node 91 (clstr_volts(1), clstr_volts(2), etc.) is directed to a monitoring circuit as described in the above-referenced patent application.

A positive electrode conductor 85 from one end of the stack 80 and a negative electrode conductor 88 from the opposite end of the stack 80 are connected to a separate summing node or junction 90 to provide a measurement of the total voltage of the stack 80 across all of the individual cells 84 in clusters 86 and 87 which form the stack 80.

According to the unique method of the present invention, the total cell voltage as shown by output 92 from the summing node 90 is used as a dividend labeled total_cell_volts and is divided by the total cell 84 count (K_TOTAL_CELLS_CNT) forming the stack 80 as shown by the constant 96 in step 94. The output of the division step is the average cell volts (cell_volts_ave) as shown by reference number 98 for the stack 80.

Figure 4:
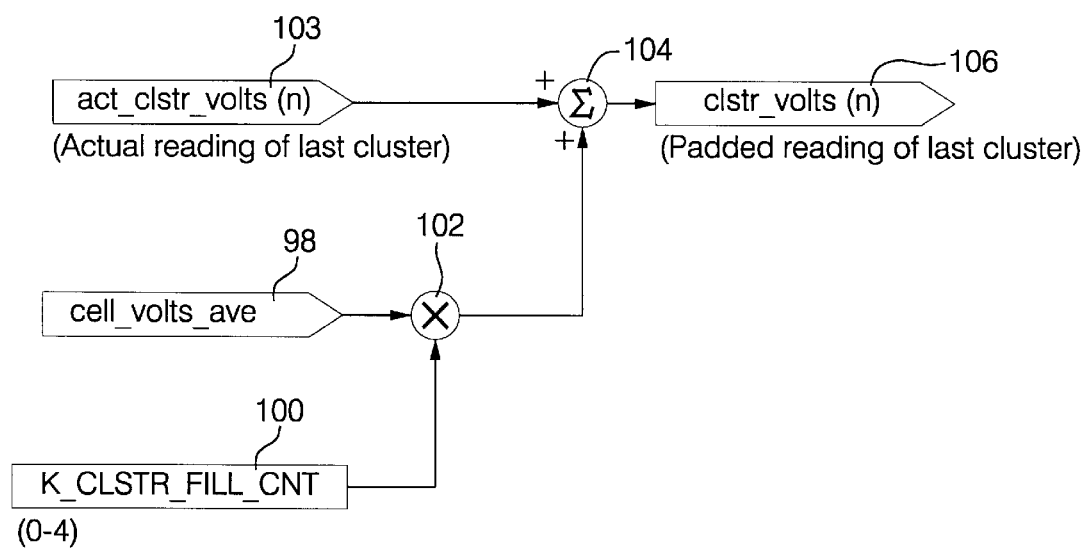
FIG. 4 is a flow/control diagram of a cluster voltage generating method according to the present invention.

The method of the present invention, as shown in FIGS. 3 and 4, may be implemented in hardware or software. A software implementation is described herein due to its easy adaptability in the controller or EECM 70.

In FIG. 4, a constant 100 labeled K_CLSTR_FILL_CNT is used to represent the difference between the number of cells 84 in each of the first clusters 86 and the number of cells 84 in the second or last cluster 87. In the present example, the constant 100 equals one (4-3). The constant 100 is multiplied by the average cell voltage (cell_volts_ave) 98 in step 102. The result is summed with a separate input (act_clstr_volts(n)) 103 representing the actual measured voltage across the second, last cluster 87 as generated by the summing node or junction 89 in FIG. 3. The resulting output 106 labeled "clstr_volts(n)", represents a padded or pseudo total voltage for the cells 84 in the second cluster 87 as if the last cluster 87 contains the same number of cells 84 as in all of the first clusters 86.

In this manner, each of the cluster voltages output from the respective summer nodes 89 and 91 can be separately input to a standard voltage monitoring circuit and treated identically to detect a low voltage of any one cluster despite the fact that the last cluster 87 contains a different number of cells 84 than the number of cells 84 in the other clusters 86.

The output 106 is generated continuously during operation of the fuel cell 22 to provide continuous monitoring of the second cluster 87 and a recalculation of the pseudo voltage of the cluster 87 for use by the monitoring circuit.

In summary, there has been disclosed a unique method of equalizing cluster voltages in a fuel cell for use by a fuel cell monitoring circuit wherein a common monitoring circuit or method can be used with fuel cell clusters containing any identical number of cells, and particularly, where at least one of the cells has a different number of cells than the number of cells in the remaining clusters of the stack. This eliminates the need for a special circuit or monitoring method for the non-identical cluster. The present method is also transparent to the number of cells forming each cluster thereby enabling its use along with the corresponding fuel cell monitoring circuit with fuel cell stacks containing any number of cells and even fuel cell stacks from different manufacturers.

What is claimed is:

1. In a method of operating a fuel cell apparatus wherein a hydrogen-rich stream is supplied to a stack of fuel cells, wherein the fuel cell stack includes a plurality of first clusters formed of identical number of fuel cells and at least one second cluster formed of a different number of fuel cells, the improvement comprising:

measuring the voltage across the entire fuel cell stack;

measuring the voltage across the second cluster of fuel cells; and creating a pseudo cluster voltage for the second cluster based on the average cell voltage of all of the cells in the fuel cell stack, the actual voltage across the second cluster and the difference between the number of cells in the first clusters and the number of cells in the second cluster, wherein that the pseudo cluster voltage for the second cluster is compared with the voltage across each first cluster for monitoring of the performance of the fuel cell.

2. The method of claim 1 wherein the step of creating the pseudo cluster voltage for the second cluster comprises the steps of:

(a) determining the average cell voltage for the entire stack;

(b) multiplying the average cell voltage for the entire stack by the difference between the number of cells in the first clusters and the number of cells in the second cluster; and (c) adding the product of step b to the actual measured voltage across the second cluster.

3. The method of claim 1 wherein the step of creating the pseudo cluster voltage for the second cluster further comprises the steps of:

(a) establishing a constant equal to the difference between the number of cells in each of the first clusters and the number of cells in the second cluster;

(b) multiplying the constant by the average cell voltage across the entire stack; and (c) adding the resultant product of step (b) to the actual measured voltage across the second cluster.

4. In a method of operating a fuel cell apparatus wherein a hydrogen-rich stream is supplied to a stack of fuel cells, wherein the fuel cell stack includes a plurality of first clusters formed of identical number of fuel cells and at least one second cluster formed of a different number of fuel cells, the improvement comprising:

measuring the voltage across the entire fuel cell stack;

measuring the voltage across the second cluster of fuel cells; and adjusting the measured voltage across the second cluster of fuel cells by a factor equivalent to the average cell voltage for each fuel cell multiplied by the difference between the number of fuel cells in the second cluster and the number fuel cells in each first cluster.

5. In a method of operating a fuel cell apparatus wherein a hydrogen-rich stream is supplied to a stack of fuel cells, wherein the fuel cell stack includes a plurality of first clusters formed of identical number of fuel cells and at least one second cluster formed of a different number of fuel cells, the improvement comprising:

measuring the voltage across the entire fuel cell stack;

measuring the voltage across the second cluster of fuel cells; and creating a pseudo cluster voltage for the second cluster by adding a product of the average cell voltage for the entire fuel cell stack and the difference between the number of cells in the second cluster and the number of cells in each first cluster to the measured voltage across the second cluster, wherein the pseudo cluster voltage for the second cluster is compared to the voltage across each first cluster for monitoring the performance of the fuel cell.

6. A fuel cell voltage monitoring system comprising:

a fuel cell stack including a plurality of first clusters formed of a first number of fuel cells and at least one second cluster formed of a second number of fuel cells, wherein said first number is different than said second number;

a first voltage sensor that measures voltage across said fuel cell stack;

a second voltage sensor that measures voltage across said second cluster; and a pseudo cluster voltage generator that includes an average voltage calculator for determining an average cell voltage of fuel cells in said fuel cell stack and a second cluster fill counter that stores a difference between said first and second numbers, wherein said pseudo cluster voltage generator creates a pseudo cluster voltage based on said average cell voltage, said voltage across said second cluster and said difference between said first and second numbers.

7. The fuel cell voltage monitor of claim 6 wherein said pseudo cluster voltage generator multiplies said average cell voltage by said difference.

8. The fuel cell voltage monitor of claim 7 wherein said pseudo cluster voltage generator further includes:

an adder that adds said actual measured voltage across said second cluster to said pseudo cluster voltage.

9. The fuel cell voltage monitor of claim 8 further comprising:

a third voltage sensor that senses voltage across at least one of said first clusters; and a comparing circuit that compares said pseudo cluster voltage to said voltage across said at least one of said first clusters.

* * * * *